(12) United States Patent
Sakaguchi et al.

(10) Patent No.: US 11,494,389 B2
(45) Date of Patent: Nov. 8, 2022

(54) RECOMMENDATION SYSTEM AND RECOMMENDATION METHOD

(71) Applicant: HONDA MOTOR CO., LTD., Tokyo (JP)

(72) Inventors: Hiroyuki Sakaguchi, Wako (JP); Mototsugu Kubota, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/210,676

(22) Filed: Mar. 24, 2021

(65) Prior Publication Data
US 2021/0303581 A1 Sep. 30, 2021

(30) Foreign Application Priority Data
Mar. 31, 2020 (JP) .............................. JP2020-064599

(51) Int. Cl.
*G06F 16/2457* (2019.01)
*G06F 3/01* (2006.01)
*G06F 16/248* (2019.01)
*G06F 3/04883* (2022.01)
*G06F 3/0346* (2013.01)
*G06F 3/041* (2006.01)

(52) U.S. Cl.
CPC ........ *G06F 16/24575* (2019.01); *G06F 3/016* (2013.01); *G06F 3/0346* (2013.01); *G06F 3/041* (2013.01); *G06F 3/04883* (2013.01); *G06F 16/248* (2019.01)

(58) Field of Classification Search
None
See application file for complete search history.

(56) References Cited

U.S. PATENT DOCUMENTS

| | | | | |
|---|---|---|---|---|
| 2015/0046375 A1* | 2/2015 | Mandel | ..................... | G06N 5/02 706/11 |
| 2015/0118663 A1* | 4/2015 | Levy | ........................ | G09B 5/02 434/236 |
| 2015/0358415 A1* | 12/2015 | Cronin | .................... | G06Q 50/01 709/217 |
| 2016/0104486 A1* | 4/2016 | Penilla | ............... | G01C 21/3641 704/232 |
| 2016/0232131 A1* | 8/2016 | Liu | ........................ | G06Q 10/06 |
| 2016/0232137 A1* | 8/2016 | Liu | ........................ | G06F 40/14 |
| 2016/0232201 A1* | 8/2016 | Goran | ..................... | G06F 3/017 |
| 2016/0234184 A1* | 8/2016 | Liu | ........................ | G06F 3/0484 |
| 2017/0220652 A1* | 8/2017 | Kazi | ...................... | G06Q 50/01 |

(Continued)

FOREIGN PATENT DOCUMENTS

JP 2016-18519 2/2016

*Primary Examiner* — Toan H Vu
(74) *Attorney, Agent, or Firm* — Rankin, Hill & Clark LLP

(57) ABSTRACT

A recommendation system includes: an input operation mode recognition unit configured to recognize a mode of an input operation from a user to an input device; a user mood estimation unit configured to estimate a mood of the user, based on the mode of the input operation; a proposal activity information acquisition unit configured to access an activity database, to extract a proposal activity suitable for the mood of the user, and to acquire information on the proposal activity; and an output control unit configured to allow an output device to output the information on the proposal activity, the output device being used by the user.

12 Claims, 13 Drawing Sheets

(56) References Cited

U.S. PATENT DOCUMENTS

| | | | | |
|---|---|---|---|---|
| 2017/0220677 A1* | 8/2017 | Kazi | .................... | G06F 16/3344 |
| 2018/0342005 A1* | 11/2018 | Yuhara | .................... | H04W 4/48 |
| 2019/0370556 A1* | 12/2019 | Kline | .................... | G06V 40/174 |
| 2019/0385066 A1* | 12/2019 | Dong | .................... | B25J 11/0005 |
| 2020/0257723 A1* | 8/2020 | Kano | .................... | G06F 16/637 |

* cited by examiner

FIG. 1
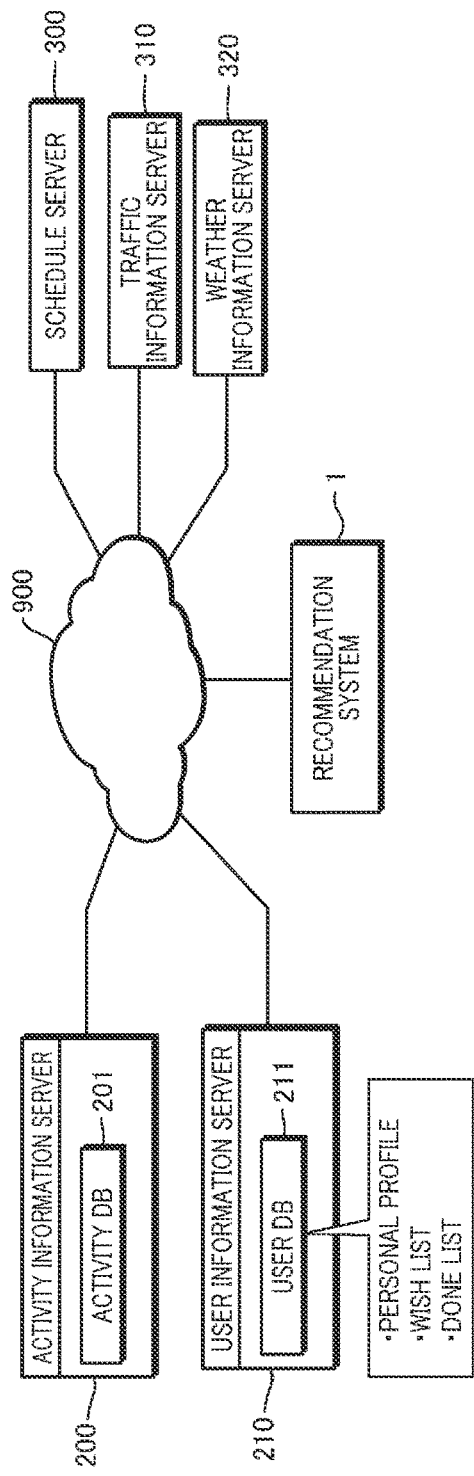
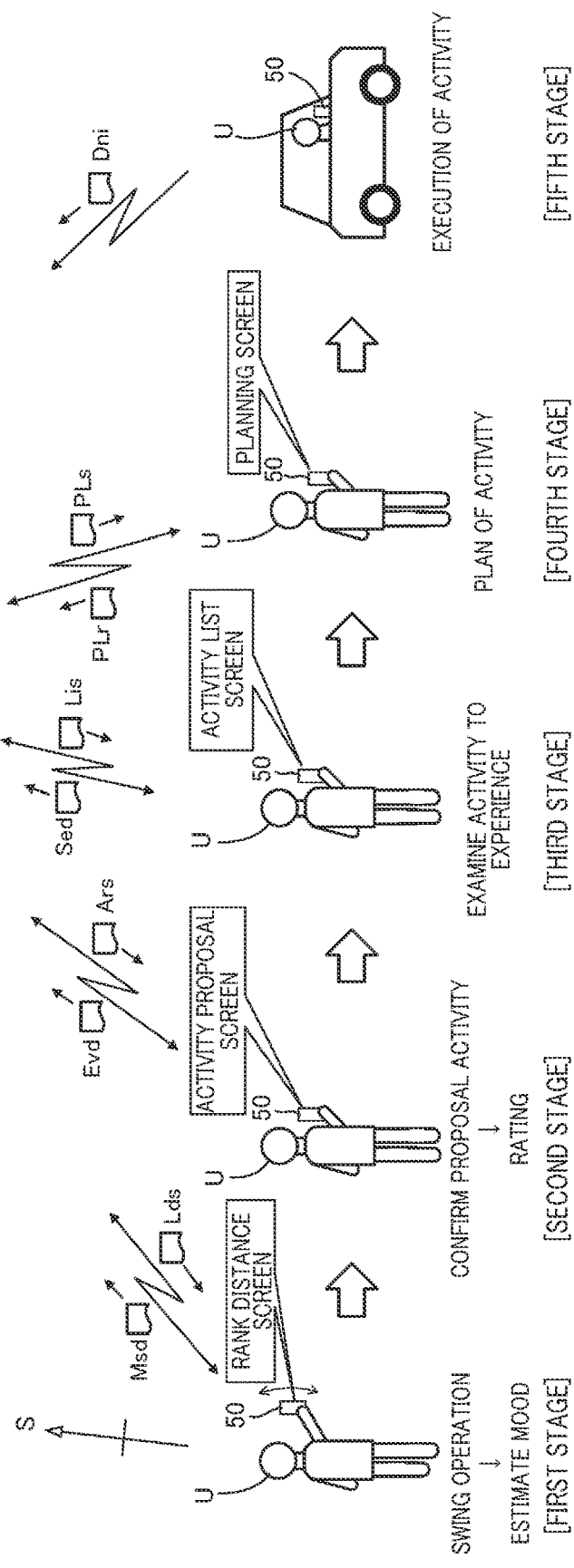

FIG. 8

| ACTIVITY ID | ACTIVITY GENRE | RANK FOR EACH EVALUATION ELEMENT | | | | | |
|---|---|---|---|---|---|---|---|
| | | REQUIRED TIME | MOVING DISTANCE | ACTIVITY AMOUNT | DIFFICULTY LEVEL | PERIOD OF TIME | PREFERENCE |
| AT01 | POTTERY EXPERIENCE | 5 | 7 | 5 | 3 | 8 | 7 |

FIG. 12

| USER ID | PREFERENCE CATEGORY A | PREFERENCE CATEGORY B | PREFERENCE CATEGORY C | PREFERENCE CATEGORY D | PREFERENCE CATEGORY E |
|---|---|---|---|---|---|
| U01 | Like | Like | – | – | – |
| U02 | Like | – | Like | – | Like |
| U03 ← FIRST USER | Like | – | Like | – | – |
| U04 | Like | Like | Like | – | – |
| PERCENTAGE FAVORED BY USER OTHER THAN U03 | | 0.67 (RECOMMENDED) | | 0.00 | 0.33 |

| | ACTIVITY B1 | ACTIVITY B2 | ACTIVITY B3 | ACTIVITY B4 |
|---|---|---|---|---|
| PRIOR PROBABILITY | 0.25 | 0.25 | 0.25 | 0.25 |

×

W

| | ACTIVITY B1 | ACTIVITY B2 | ACTIVITY B3 | ACTIVITY B4 |
|---|---|---|---|---|
| SUNNY | 0.8 | 0.3 | 0.1 | 0.2 |
| CLOUDY | 0.1 | 0.3 | 0.1 | 0.5 |
| RAINY | 0.1 | 0.2 | 0.5 | 0.2 |
| OTHERS | 0 | 0.2 | 0.3 | 0.1 |

RECOMMENDATION SYSTEM AND RECOMMENDATION METHOD

INCORPORATION BY REFERENCE

The present application claims priority under 35 U.S.C. § 119 to Japanese Patent Application No. 2020-064599 filed on Mar. 31, 2020. The content of the application is incorporated herein by reference in its entirety.

BACKGROUND OF THE INVENTION

Field of the Invention

The present invention relates to a recommendation system and a recommendation method.

Description of the Related Art

In the related arts, a travel package reservation support device has been proposed in which a travel package is selected from travel packages whose tourist destinations and dates are predetermined according to reservation application information including a departure date input from an information terminal and an itinerary incorporating a sightseeing option specified in the reservation application information is displayed in a provisional itinerary based on the selected travel package (see Japanese Patent Laid-Open No. 2016-18519, for example).

In the travel package reservation support device, a case where a user decides a travel itinerary and a sightseeing option is the same in terms of a procedure a case where a user decides an itinerary by looking at a travel pamphlet. Therefore, it is assumed that user does not feel freshness and is uninterested and the user does not feel the need to actively utilize the device for the purpose of examining an activity such as travel.

The present invention has been made in view of the above circumstances, and is to provide a recommendation system and a recommendation method that can be actively utilized by users who examine an activity.

SUMMARY OF THE INVENTION

In order to achieve the above-described object, a first aspect of the present invention is to provide a recommendation system including: an input operation mode recognition unit configured to recognize a mode of an input operation from a user to an input device; a user mood estimation unit configured to estimate a mood of the user, based on the mode of the input operation recognized by the input operation mode recognition unit; a proposal activity information acquisition unit configured to access an activity database in which activity information is stored, to extract a proposal activity suitable for the mood of the user estimated by the user mood estimation unit, and to acquire information on the proposal activity; and an output control unit configured to allow an output device to output the information on the proposal activity acquired by the proposal activity information acquisition unit, the output device being used by the user.

In the recommendation system, the input device may be gripped and used by the user, and the input operation may be a displacement operation of the input device by the user. The input operation mode recognition unit may recognize, based on a detection signal of a motion sensor provided in the input device, at least one of a displacement amount, a displacement direction, a displacement speed, and a displacement acceleration of the input device due to the displacement operation, as the mode of the input operation.

In the recommendation system, the displacement operation may be an operation in which the user swings a hand with which the input device is gripped.

In the recommendation system, the input device may include a touch panel, and the input operation may be an operation of the touch panel by the user. The input operation mode recognition unit may recognize at least one of a duration time of a touch operation on the touch panel, a direction of a swipe operation, a speed of the swipe operation, and a path of the swipe operation, as the mode of the input operation.

In the recommendation system, the input device may include a touch panel, and the input operation may be an operation of the touch panel by the user. The input operation mode recognition unit may recognize that the user touches any one of a plurality of selection areas having different shades or colors displayed on the touch panel, as the mode of the input operation.

In the recommendation system, the recommendation system may further include an orientation recognition unit configured to recognize an orientation in which the user or the input device is directed, and the proposal activity information acquisition unit may extract the proposal activity from activities that can be experienced in an area of the orientation in which the user or the input device is directed, which is recognized by the orientation recognition unit.

In the recommendation system, the activity information stored in the activity database may include information on a preference suitable for an activity, the recommendation system may include a user preference information acquisition unit configured to access a user database in which preference information of the user is stored and to acquire the preference information of the user, the user mood estimation unit may estimate, as the mood of the user, a high degree of positiveness of the user, and the proposal activity information acquisition unit may extract an activity in which suitability with a preference of the user recognized from the preference information of the user acquired by the user preference information acquisition unit is equal to or higher than a predetermined suitability determination level, as the proposal activity, and may set the suitability determination level to be low as the positiveness of the user estimated by the user mood estimation unit becomes higher.

In the recommendation system, the activity information stored in the activity database may include an assumption activity amount of an activity experiencer, the user mood estimation unit may estimate a high degree of positiveness of the user as the mood of the user, and the proposal activity information acquisition unit may extract the proposal activity such that the assumption activity amount of the experiencer becomes larger as the positiveness of the user estimated by the user mood estimation unit becomes higher.

In the recommendation system, the activity information stored in the activity database may include information on a place where an activity can be experienced, the recommendation system may include a current position recognition unit configured to recognize a current position of the user or the input device, and the proposal activity information acquisition unit may extract the proposal activity such that a distance from the current position of the user or the input device recognized by the current position recognition unit to an experience place of the activity becomes longer as positiveness of the user estimated by the user mood estimation unit becomes higher.

In order to achieve the above-described object, a second aspect of the present invention is to provide a recommendation method executed by a computer, the method including: an input operation mode recognition step of recognizing a mode of an input operation from a user to an input device; a user mood estimation step of estimating a mood of the user, based on the mode of the input operation recognized in the input operation mode recognition step; a proposal activity information acquisition step of accessing an activity database in which activity information is stored, extracting a proposal activity suitable for the mood of the user estimated in the user mood estimation step, and acquiring information on the proposal activity; and an output control step of allowing an output device to output the information on the proposal activity acquired in the proposal activity information acquisition step, the output device being used by the user.

According to the recommendation system, the user can easily obtain information on the proposal activity that is expected to be suitable for a current mood by performing a simple action of changing the model of the input operation according to his/her mood. Therefore, it can be expected that the recommendation system is actively utilized by users who examine an activity.

BRIEF DESCRIPTION OF THE DRAWINGS

FIG. 1 is an explanatory diagram of an activity proposal by a recommendation system and utilization of the recommendation system by a user;

FIG. 8 is an explanatory diagram of evaluation elements set for an activity;

FIG. 12 is an explanatory diagram of a plurality of types of preference categories set for a user; and FIG. 13 is an explanatory diagram of prior probabilities and conditional probabilities set for activities.

DETAILED DESCRIPTION OF THE PREFERRED EMBODIMENT 1-0. Proposal of Activity with Recommendation System With reference to FIG. 1, a proposal of an activity executed by a recommendation system 1 of the present embodiment to a user U and an aspect of utilization of the recommendation system 1 by the user U will be described. FIG. 1 shows a process in which the user U utilizes information on the activity proposed from the recommendation system 1 to experience the activity in five stages from a first stage to a fifth stage in a time series.

Figure 6:
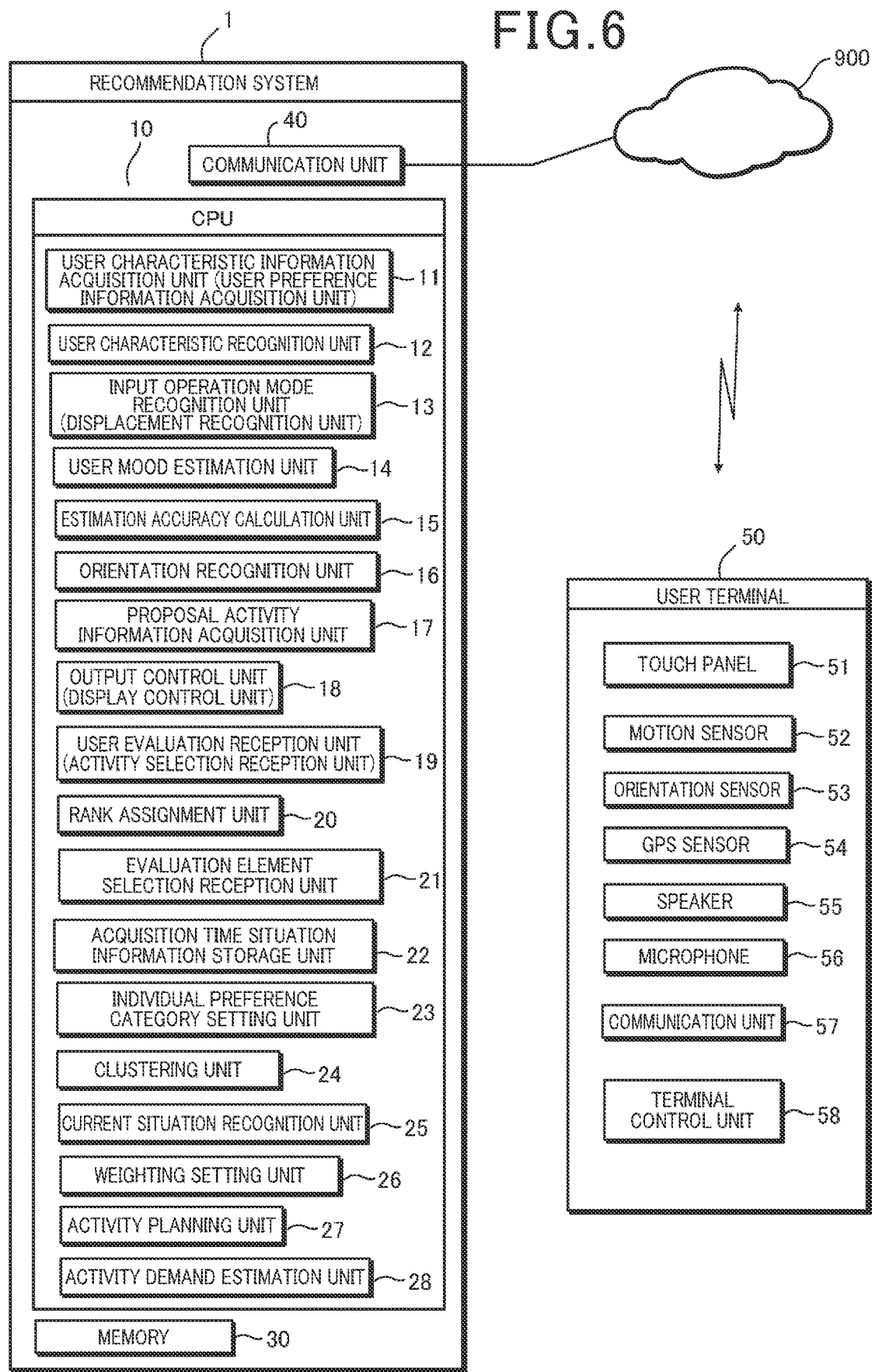
FIG. 6 is a schematic diagram showing a configuration of a recommendation system.

The recommendation system 1 is a computer system including a CPU (Central Processing Unit) 10, a memory 30, and a communication unit 40 as shown in FIG. 6, but details thereof will be described below. The recommendation system 1 communicates with, via a communication network 900, a user terminal 50, an activity information server 200, a user information server 210, a schedule server 300, a traffic information server 310, and a weather information server 320 to be used by the user.

The user terminal 50 is a portable communication terminal that is gripped and used by the user U, and communicates with the recommendation system 1 via the communication network 900. The user terminal 50 is a smartphone, a mobile phone, or a tablet terminal, for example. As shown in FIG. 6, the user terminal 50 includes a touch panel 51, a motion sensor 52, an orientation sensor 53, a GPS (Global Positioning System) sensor 54, a speaker 55, a microphone 56, a communication unit 57, and a terminal control unit 58.

The motion sensor 52 detects acceleration in three directions of a front-back direction, a left-right direction, and an up-down direction generated in the user terminal 50. The orientation sensor 53 detects an orientation in which the user terminal 50 is directed. The GPS sensor 54 detects a current position of the user terminal 50. The communication unit 57 communicates with the recommendation system 1 via the communication network 900. The terminal control unit 58 is configured by a CPU and a memory which are not shown, and executes various applications (application programs) stored in the memory.

The user U downloads an application (application program) of an activity proposal service provided from the recommendation system 1 to the user terminal 50. Then, the user U executes the application of the activity proposal service on the user terminal 50 to use the activity proposal service with the recommendation system 1. At the time of starting to use the activity proposal service, the user U applies for personal information to the recommendation system 1 and registers as a member. The personal information includes a gender, age, place of residence, occupation, and preference of the user U.

The activity information server 200 includes an activity DB (Data base) 201 in which information on various activities is stored. The activity information includes a genre of the activity, a content of the activity, an address of a facility where the activity can be experienced, a distance to the facility, an access method to the facility, a time required for the activity experience, a skill required for the activity experience, an assumption amount of the activity, and a cost of the activity. Further, the activity information is ranked for each of different evaluation elements as shown in FIG. 8. In the example of FIG. 8, the evaluation elements include a time required for the activity, a moving distance to the facility where the activity can be experienced, an amount of the activity, a difficulty level of the activity, a period of time suitable for the activity, and a preference suitable for the activity.

The user information server 210 includes a user DB 211 in which information of each user who has registered as a member is stored. The user information includes a personal file, a wish list, and a done list, for example.

The personal file is recorded with user's personal information, for example, a user ID, a gender, an age, a place of residence, an occupation, a preference, and a skill related to the experience of the activity. The wish list is recorded with a selection activity which is an activity selected by the user (a user's evaluation being at a predetermined level or higher) among activities proposed to the user from the recommendation system 1 until now.

In addition, the wish list is recorded with a user's evaluation of the selection activity. Further, the selection activity recorded in the wish list is divided into a Do that the user decides to experience by a selection operation of the user and a Wish that is under consideration.

In the Done list, the activity that the user has experienced so far are registered with information on a date and time of the experience and a user's evaluation.

1-1. First Stage

Figure 2:
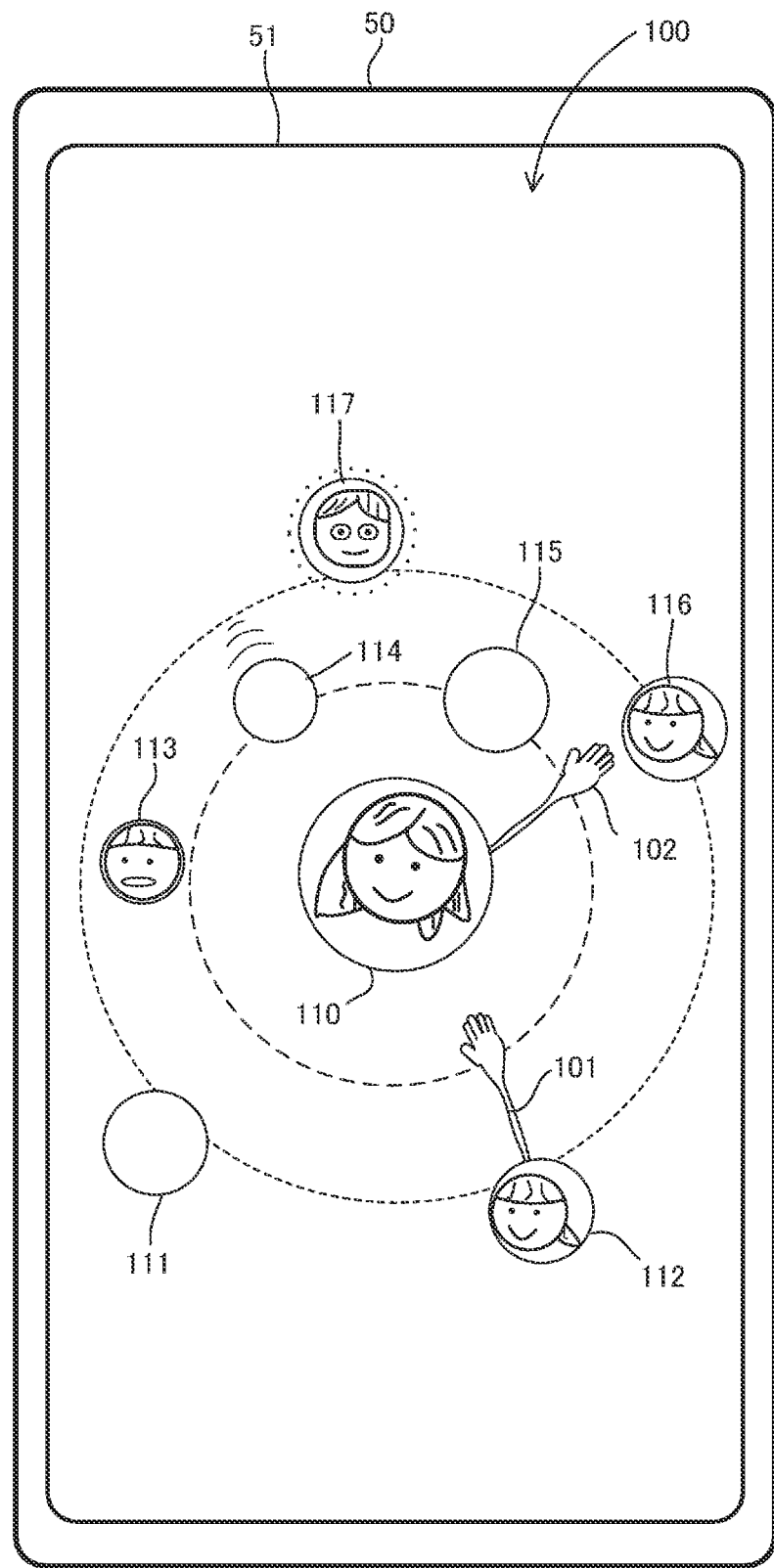
FIG. 2 is an explanatory diagram of a rank distance screen.

In a first stage, when the user U activates the application of the activity proposal service on the user terminal 50, data Lds of a rank distance screen is transmitted from the recommendation system 1 to the user terminal 50. Then, a rank distance screen 100 is displayed on the touch panel 51 in the user terminal 50 as shown in FIG. 2.

On the rank distance screen 100, a user icon 110 indicating the user U is located substantially at a center of the screen. Then, activity icons 111 to 117 are located that are closer to the user icon 110 as the rank of the evaluation element becomes higher, the activity icons indicating activities extracted from the selected activities recorded in the wish list based on any of the evaluation elements (see FIG. 8) selected by the user U.

For example, when the selected evaluation element is "required time", as the required time becomes shorter, the rank of the activity becomes higher and a distance between the corresponding activity icon and the user icon 110 becomes shorter. In the example of FIG. 2, the user U can intuitively recognize, for example, that the time required for the activity corresponding to the activity icon 115 is shorter than the activity corresponding to the activity icon 111. Therefore, the user U can easily recognize the activity that can be experienced in a short time.

A display correspondence of each of the activity icons 111 to 117 may be changed according to a genre of the corresponding activity, an area where the activity can be experienced, a provider of the activity, and a prospective participant in the activity. In FIG. 2, the activity icons 116 and 112 have the same face character and indicate activity icons corresponding to the same provider or prospective participant. In addition, the activity icon 117 is displayed with high lighting (for example, flushing) and indicates that another user has decided to experience the activity or that another user is experiencing the activity.

In addition, the activity icon 114 is gradually approaching the user icon 110, and indicates that a recommendation level of the corresponding activity is rapidly increasing. For example, activities that have recently been added to the wish list and activities that are suitable for changes in the current state of the user are extracted as activities whose recommendation level is rapidly increasing.

An arm 102 extends from the user icon 110 to the activity icon 116, which indicates that the user U proposes to participate in the activity together for the prospective participant in the activity corresponding to the activity icon 116 (inviting state). Further, an arm 101 extends from the activity icon 112 to the user icon 110, which indicates that the prospective participant corresponding to the activity icon 112 proposes to participate in the activity together for the user U (invited state).

The user U can arrange to experience the activity together with other prospective participants by touching the activity icon 112 and performing a predetermined accompanying permission operation. Further, when the prospective participant corresponding to the activity icon 116 approves the invitation from the user U, the shape of the arm 102 changes to a shape in which both ends are hands. Thus, the user U can recognize that the invitation that the user U proposed has been accepted and can arrange to experience the activity together with other prospective participants.

By touching the user icon 110, The user U can sequentially switch the evaluation elements and see the rank distance screen with other evaluation elements. Thus, the user U can intuitively recognize the degree of difference between activities due to the difference in a distance on the rank distance screen from different viewpoints of an experience time, a required time, and a required skill and can examine the activity to be experienced.

Next, the user U swings the hand with which the user terminal 50 is gripped when requesting the recommendation system 1 to propose a new activity. Thus, motion detection data Msd detected by the motion sensor 52 is transmitted from the user terminal 50 to the recommendation system 1.

Figure 3:
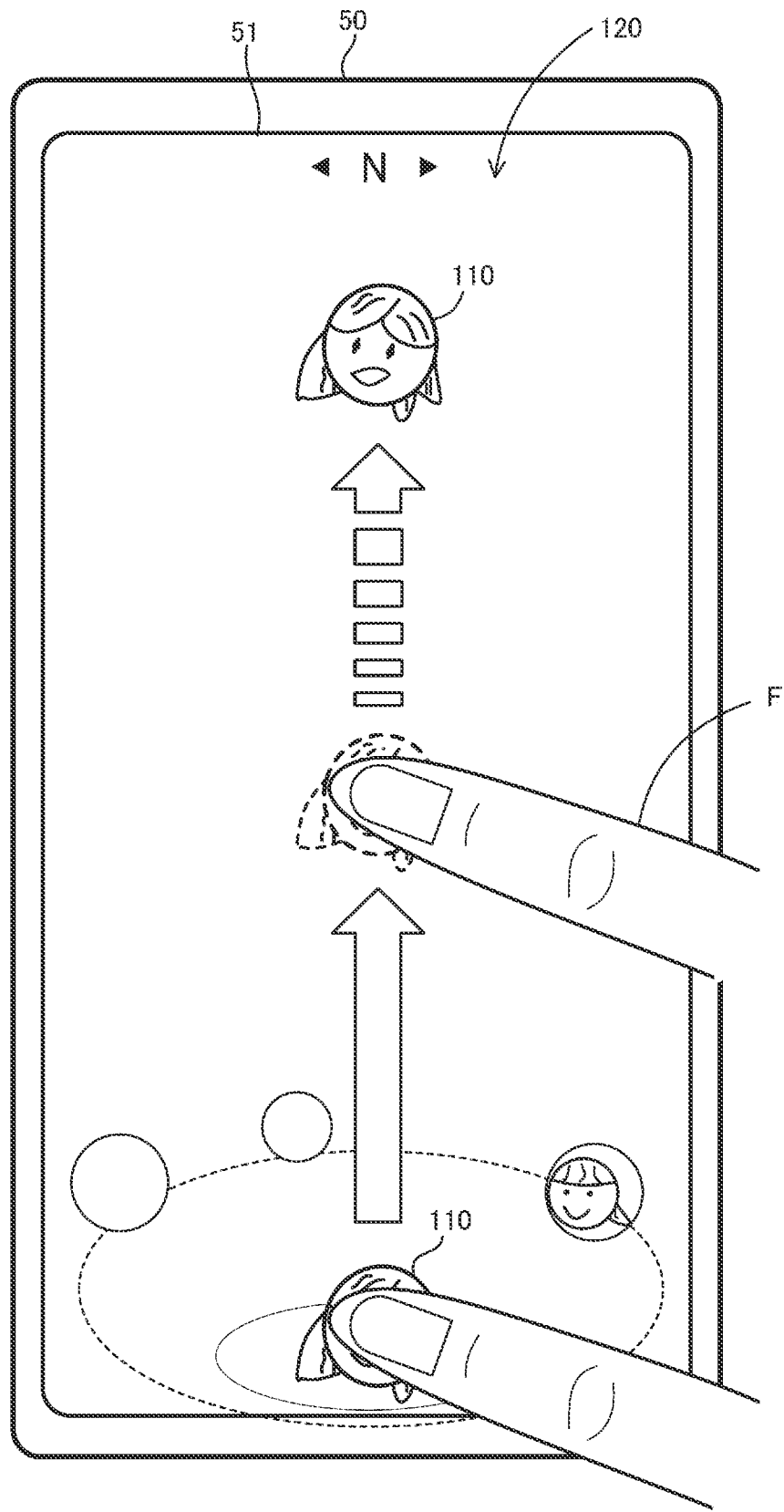
FIG. 3 is an explanatory diagram of a throwing screen of a user icon.

In addition, the user U can request the recommendation system 1 to propose a new activity by an operation of swiping the user icon 110 as shown in FIG. 3 in addition to the operation of displacing the user terminal 50. As shown in FIG. 3, the user U moves the finger F from the screen by a swipe operation of touching the user icon 110 with the finger F to move the user icon 110 to a lower part of the screen and then sliding the finger F touching the user icon 110 to an upper part of the screen. Thus, the motion detection data Msd indicating the moving distance and the moving speed of the user icon 110 is transmitted from the user terminal 50 to the recommendation system 1.

1-2. Second Stage

In a second stage, the recommendation system 1 recognizes a size and a speed of a swing by the user U based on the motion detection data Msd, and estimates a mood of the user U. Then, the recommendation system 1 accesses the activity DB 201, extracts a proposal activity suitable for the mood of the user U, and transmits data Ars of an activity proposal screen displaying information of the proposal activity to the user terminal 50.

Figure 4:
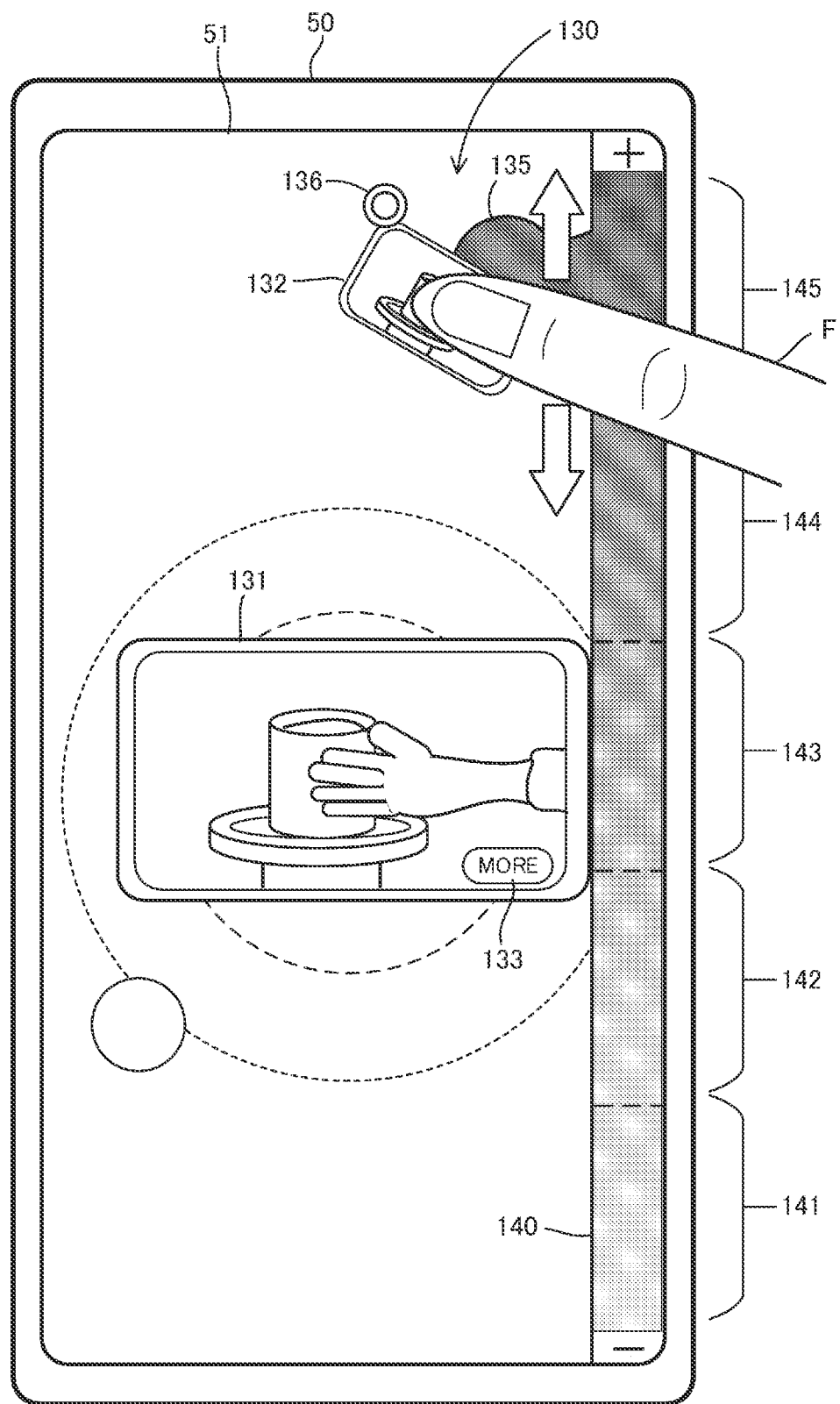
FIG. 4 is an explanatory diagram of an activity proposal screen.

On the user terminal 50, as shown in FIG. 4, an activity proposal screen 130 is displayed on the touch panel 51. The activity proposal screen 130 displays a proposal activity image display portion 131 that displays an image of the proposal activity extracted by the recommendation system 1, a proposal activity icon 132, and an evaluation slider 140 used to input an evaluation of the user U for the proposal activity.

FIG. 4 shows a case where a pottery experience is extracted as a proposal activity. The user U touches a detail button 133 of the proposal activity image display portion 131 and can display more detailed information of the proposal activity on the touch panel 51. The evaluation slider 140 includes five sub-areas 141 to 145 having different colors and shades and a pointer 135, and the proposal activity icon 132 is displayed in the vicinity of the pointer 135.

The user U evaluates the proposal activity in five stages by touching the pointer 135 with a finger F and sliding the pointer 135 up and down to move it to any of the sub-areas 141 to 145. When the range of the sub-area 141 is the lowest rank (rank 1), and the range of the sub-area 145 is the highest rank (rank 5). The pointer 135 causes the user terminal 50 to transmit evaluation data Evd indicating the rank of the evaluation by the user U to the recommendation system 1.

The recommendation system 1 adds the proposal activity as a selection activity to the wish list. When the evaluation data Evd received from the user terminal 50 is at a predetermined level or higher (for example, rank 4 or higher), the proposal activity may be added to the wish list as a selection activity. When the position of the pointer 135 is a position corresponding to the predetermined level or higher, a mark 136 indicating that the selection is being made at a corner of the icon 132 is displayed.

1-3. Third Stage

Figure 5:
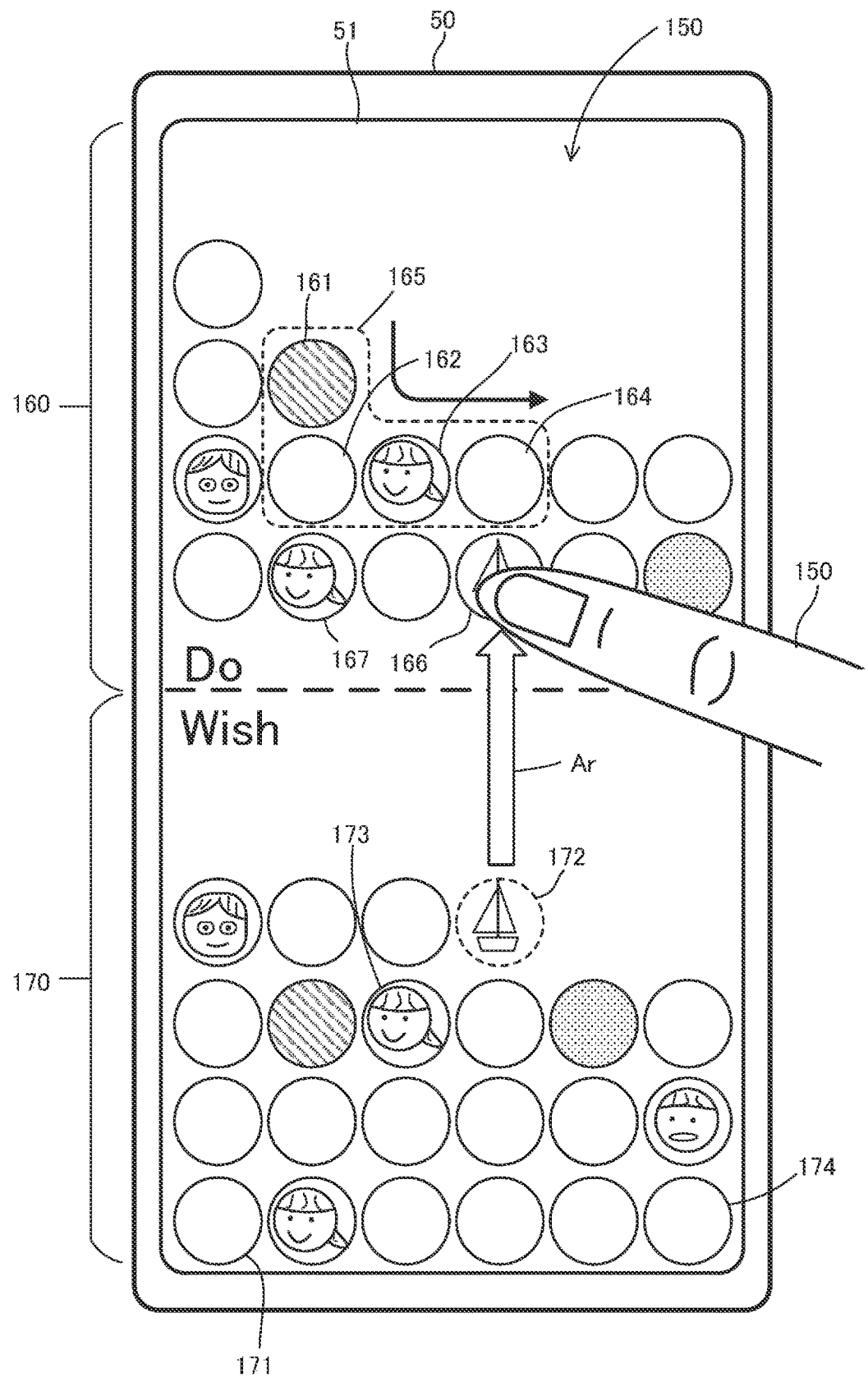
FIG. 5 is an explanatory diagram of an activity list screen.

In a third stage, the user terminal 50 receives data Lis of an activity list screen transmitted from the recommendation system 1, and displays the activity list screen on the touch panel 51. As shown in FIG. 5, the activity list screen 150 displays, in an upper area 160 of the touch panel 51, activity icons of activities divided in Do (execution intention of the user U being shown) among the activities registered in the wish list in a list form in an arrangement mode according to a predetermined condition.

Further, the activity list screen 150 displays, in a lower area 170 of the touch panel 51, activity icons of activities divided in Wish (execution intension of the user being not shown). An activity icon 174 corresponding to the activity newly selected by the user U is arranged at a right end of the bottom, and other activity icons sequentially move up from right to left and from bottom to top. The user U can touch each of the activity icons with the finger F to display detailed information of the corresponding activity.

When deciding the activity to be experienced, the user U slides the activity icon corresponding to the decided activity from the wish area 170 to do area 160. FIG. 5 shows an example in which the activity icon 172 slides from the wish area 170 to the do area 160. In this case, the user extracts an activity whose experience place is close to the activity corresponding to the activity icon 172 from the activities whose activity icons are displayed in the do area, and may move the activity icon of the extracted activity around the activity icon 172.

The user U can combine a plurality of corresponding activities into one group by continuously touching a plurality of activity icons displayed in the do area 160. FIG. 5 shows an example in which the activity icons 161 to 164 are continuously touched to combine into one group 165.

1-4. Fourth Stage

In a fourth stage, the user U operates the user terminal 50 and transmits planning request information PLr for requesting planning of the activities combined into one group on the activity list screen to the recommendation system 1. The recommendation system 1, which has received the planning request information PLr, creates an experience plan to efficiently go around the plurality of activities required for the group. Then, the recommendation system 1 transmits data PLs of the planning screen, which guides the created experience plan, to the user terminal 50.

The user terminal 50, which has received the data PLs of the planning screen, displays the planning screen on the touch panel 51, and the user U can create an itinerary for efficiently experiencing a plurality of activities with reference to the planning screen.

1-5. Fifth Stage

In a fifth stage, the user U sequentially visits the activity experience places and experiences the activity according to the itinerary created in the fourth stage. The user U who has experienced the activity transmits Done information Dni indicating activity evaluations (including a level of satisfaction, an experience time, and a moving time) to the recommendation system 1.

The recommendation system 1, which has received the Done information Dni, registers the activity experienced by the user U in a Done list of the user U of the user DB 211, and updates the preference of the personal file of the user U based on the evaluation of the user U. Further, the recommendation system 1 updates, based on the evaluation of the user U, the information of the activity DB 201 regarding the activity experienced by the user.

The processing of the recommendation system 1 in the first to fifth stages described above can provide a total support from the proposal to the execution of the activity to the user U, which can promote the utilization of the recommendation system 1 by the user U.

2. Configuration of Recommendation System

A configuration of the recommendation system 1 will be described with reference to FIG. 6. The recommendation system 1 includes a CPU 10 (corresponding to a computer), a memory 30, and a communication unit 40, and the communication unit 40 communicates with the user terminal 50 via the communication network 900.

The CPU 10 reads and executes the control program of the recommendation system 1 stored in the memory 30, thereby functioning as a user characteristic information acquisition unit 11, a user characteristic recognition unit 12, an input operation mode recognition unit 13, a user mood estimation unit 14, an estimation accuracy calculation unit 15, an orientation recognition unit 16, a proposal activity information acquisition unit 17, an output control unit 18, user evaluation reception unit 19, a rank assignment unit 20, evaluation element selection reception unit 21, an acquisition time situation information storage unit 22, an individual preference category setting unit 23, a clustering unit 24, a current situation recognition unit 25, a weighting setting unit 26, an activity planning unit 27, and an activity demand estimation unit 28.

The user characteristic information acquisition unit 11 accesses the user DB 211 (see FIG. 1), and acquires characteristic information (information on a gender, an age, a place of residence, and a preference) of the user U recorded in the personal file. The user characteristic information acquisition unit 11 includes a function of a user preference information acquisition unit that acquires information on the preference of the user U. The user characteristic recognition unit 12 recognizes characteristics of the user U based on the characteristic information of the user U.

The input operation mode recognition unit 13 recognizes, as a mode of the input operation of the user terminal 50 by the user U, a mode of the swing operation or the slide operation of the user icon of the user terminal 50 described above. The input operation mode recognition unit 13 includes a function of a displacement recognition unit that recognizes a displacement of the user terminal 50 due to the swing.

The user mood estimation unit 14 estimates a mood of the user U based on the mode of the input operation recognized by the input operation mode recognition unit 13. For example, the user mood estimation unit 14 estimates the mood of the user U as follows according to the input mode recognized by the input operation mode recognition unit 13. The user mood estimation unit 14 estimates positiveness of the user U in five stages.

The greater the displacement of the swing of the user terminal 50, the higher the positiveness of the user U.

The faster the swing speed of the user terminal 50, the higher the positiveness of the user U.

The higher the swing acceleration of the user terminal 50, the higher the positiveness of the user U.

The greater the swipe magnitude of the user icon 110, the higher the positiveness of the user U.

The faster the swipe speed of the user icon 110, the higher the positiveness of the user U.

The higher the swipe acceleration of the user icon 110, the higher the positiveness of the user U.

The estimation accuracy calculation unit 15 calculates estimation accuracy of the mood of the user U estimated by the user mood estimation unit 14. The estimation accuracy calculation unit 15 calculates, as estimation accuracy, a ratio of the activity selected by the user U (being moved from the Wish to Do) from the proposal activities extracted according to the mood of the user U.

The orientation recognition unit 16 recognizes an orientation, in which the user U is directed, based on orientation detection data that is detected by the orientation sensor 53 of the user terminal 50 and is transmitted from the user terminal 50 to the recommendation system 1. The orientation, in which the user terminal 50 is directed, may be recognized based on orientation detection data that is detected by a device (a wristwatch) other than the user terminal 50 possessed by the user U.

The proposal activity information acquisition unit 17 accesses the activity DB 201, extracts an activity suitable for the user U as a proposal activity, and acquires information on the proposal activity. The output control unit 18 transmits the information on the proposal activity to the user terminal 50, and allows the touch panel 51 to display the information. The output control unit 18 includes a function of a display control unit that controls the display of the user terminal 50.

The user evaluation reception unit 19 receives the selection operation of the user U for the proposal activity. The user evaluation reception unit 19 includes a function of an activity selection reception unit that receives an activity selection by the user U. The rank assignment unit 20 ranks each of the evaluation elements shown in FIG. 8 for the proposal activity. The evaluation element selection reception unit 21 receives the user's selection operation of the evaluation element at the time of display of the rank distance screen described above. The acquisition time situation information storage unit 22 stores situation information at the time when the proposal activity information acquisition unit 17 acquires the information on the proposal activity, in the activity DB 201.

The individual preference category setting unit 23 sets a preference of the user U to be assumed to have, based on the preference information reported by the user U at the time of registration in the recommendation system 1 and the selection result of the user U for the proposal activity so far. The individual preference category setting unit 23 sets a preference category that is assumed to correspond to the user U among the five types of preference categories A to E for the user U as shown in FIG. 12. In the example of FIG. 12, for example, preference category A and preference category B are set as preference categories corresponding to the user U whose user ID is U01.

The clustering unit 24 performs clustering in which users set with the overlapping preference categories are made to belong to the same class. In the example of FIG. 12, users U having user IDs U01 to U04 set with a common preference category A are clustered by the preference category A.

The current situation recognition unit 25 recognizes, as a current situation, a user-specific situation related to the user U and a general situation other than the user-specific situation. The user-specific situation includes a current position of the user U, a point in which the user U is interested, a working day of the user, and a holiday situation of the user. The current situation recognition unit 25 recognizes the current position of the user U by receiving the position detection data that is detected by the GPS sensor 54 of the user terminal 50 and is transmitted from the user terminal 50 to the recommendation system 1. In addition, the current situation recognition unit 25 accesses the schedule server 300 and recognizes the schedule of the user U, thereby recognizing the point at which the user U is interested, the working day of the user, and the holiday of the user.

Further, the current situation recognition unit 25 recognizes, as general situations, a season, a weather, a current point of time, and a traffic situation. The current situation recognition unit 25 accesses the weather information server 320 to recognize a current situation of the weather, and accesses to the traffic information server 310 to recognize the traffic situation. The weighting setting unit 26 sets weighting for a proposal activity candidate to be used when the proposal activity information acquisition unit 17 extracts the proposal activity.

The activity planning unit 27 creates a plan for an activity experience described in the fourth stage in FIG. 1. More specifically, the activity planning unit 27 accesses the traffic information server 310 to recognize an access method, a distance, and a required time from the current position of the user terminal 50 to the area or the facility where the activity is experienced, and creates a plan. Then, the activity planning unit 27 transmits the data PLs of the planning screen displaying the plan contents to the user terminal 50.

The activity demand estimation unit 28 estimates the demand of the proposal activity based on the rank of the evaluation of the proposal activity by the user U received by the user evaluation reception unit 19. In addition, the demand of the proposal activity may be estimated based on the number of activities divided in the Do. The estimation result of the demand of the proposal activity is utilized for extraction of the proposal activity in the future.

3. Display Processing of Rank Distance Screen

Figure 7:
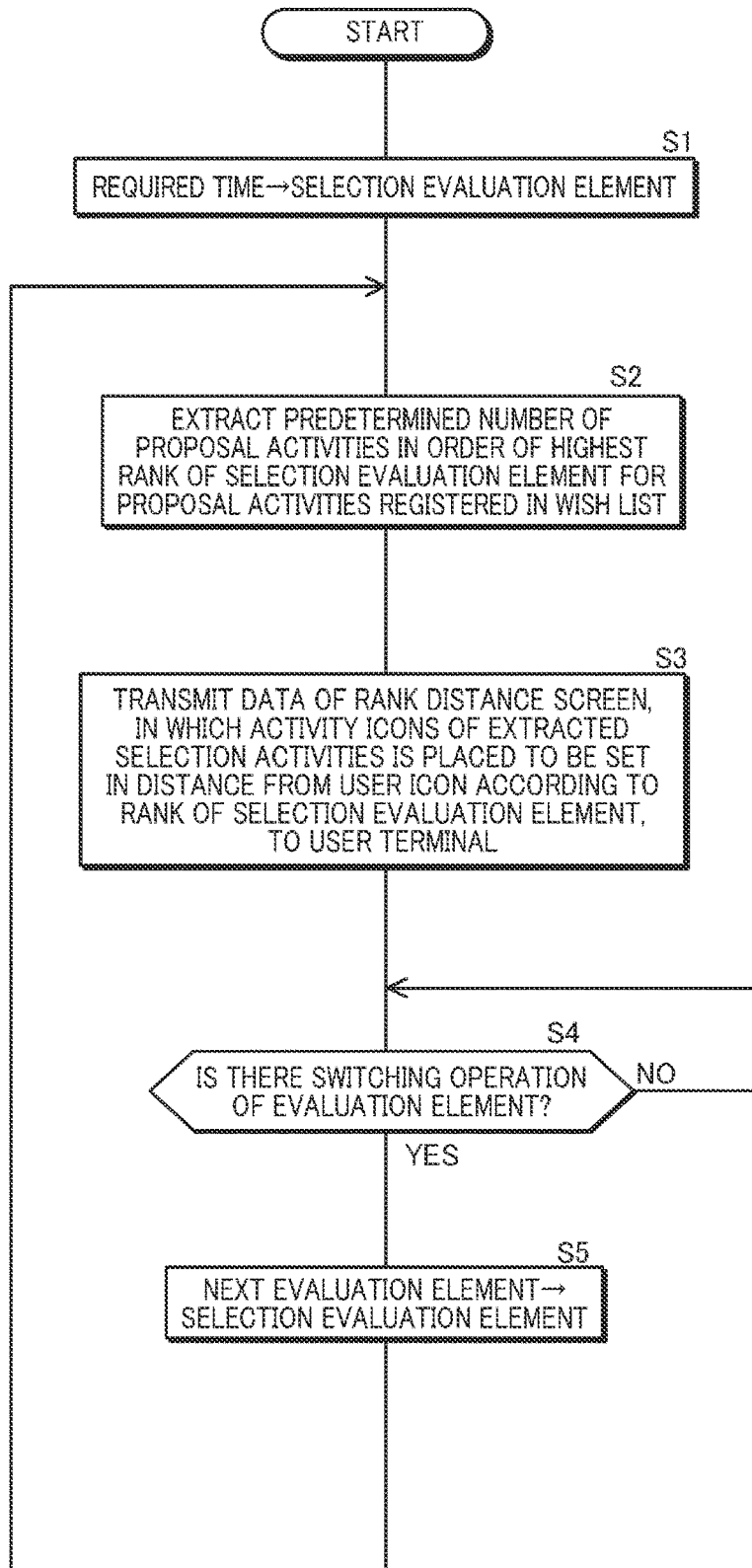
FIG. 7 is a flowchart of display processing of a rank distance screen.

Display processing of the rank distance screen will be described with reference to a flowchart shown in FIG. 7. In step S1 of FIG. 7, the output control unit 18 sets the "required time" of six evaluation elements shown in FIG. 8 as a selection evaluation element of an initial setting.

Subsequently, in step S2, the output control unit 18 extracts a predetermined number of proposal activities in order of the highest rank of the selection evaluation element for the proposal activities registered in the wish list. When the selection evaluation element is a "required time", the shorter the required time, the higher the rank, so the proposal activity is extracted in order of the shortest required time.

Subsequently, in step S3, the output control unit 18 transmits data of the rank distance screen 100, in which the distances of the activity icons 111 to 117 of the respective extracted proposal activities are shortened from the user icon 110 as the rank of the selection evaluation element increases as shown in FIG. 2, to the user terminal 50. Thus, the rank distance screen 100 is displayed on the touch panel 51 of the user terminal 50.

Subsequently, in step S4, when receiving the information on a switching instruction of the evaluation element from the user terminal 50, the output control unit 18 proceeds the process to step S5 to set a next evaluation element as a selection evaluation element, and proceeds the process to step S2. Thus, the rank distance screen 100 displayed on the touch panel 51 of the user terminal 50 is switched to a screen corresponding to the rank according to different evaluation criteria. In this way, the user U can switch the evaluation criteria in the order of required time→moving distance→activity amount→difficulty level→period of time→preference→required time→ . . . , confirm the rank distance screen 100 according to each of the evaluation criteria, and examine the activity to be experienced.

4. Display Processing of Activity Proposal Screen

Display processing of the activity proposal screen will be described with reference to a flowchart shown in FIG. 9. In step S10 of FIG. 9, the input operation mode recognition unit 13 proceeds the process to step S11 when receiving the motion detection data Msd (see FIG. 1) from the user terminal 50. In step S11, the input operation mode recognition unit 13 recognizes the mode of the input operation by the user U, based on the motion detection data Msd.

Subsequently, in step S12, the estimation accuracy calculation unit 15 determines whether the estimation accuracy of the mood of the user U so far is equal to or higher than an accuracy determination level. Here, the estimation accuracy calculation unit 15 calculates, as estimation accuracy of the mood, a ratio of the number of activities selected by the user U to the total number of activities proposed to the user U so far. The estimation accuracy calculation unit 15 proceeds the process to step S13 when the estimation accuracy of the mood of the user U is at the accuracy determination level, and proceeds the process to step S20 when the estimation accuracy of the mood of the user U is equal to or lower than the accuracy determination level. In step S20, extraction processing of the proposal activity based on the preference of the user, which will be described below, is executed.

In step S13, the user mood estimation unit 14 estimates the mood of the user U based on the mode of the input operation of the user U recognized by the input operation mode recognition unit 13. Here, the mood of the user U is estimated in five stages of positiveness as described above. Subsequently, in step S14, the orientation recognition unit 16 recognizes, based on the orientation data transmitted from the user terminal 50, the orientation in which the user terminal 50 is directed. Subsequently, in step S15, the proposal activity information acquisition unit 17 refers to the activity DB 201, and extracts the activity as a proposal activity that is suitable for the mood of the user U and can be experienced in the area of the orientation in which the user terminal 50 is directed, based on the mood (high or low of positiveness) of the user U estimated by the user mood estimation unit 14 and the orientation.

Subsequently, in step S16, the output control unit 18 transmits, to the user terminal 50, the proposal activity image display portion 131 for displaying the image of the proposal activity and the data of the activity proposal screen 130 for displaying the evaluation slider 140, as shown in FIG. 4. Thus, the activity proposal screen 130 is displayed on the touch panel 51 of the user terminal 50. The user U examines the content of the proposal activity, and evaluates the proposal activity by the operating the touch input of the evaluation slider 140.

Subsequently, in step S17, the user evaluation reception unit 19 proceeds the process to step S17 when receiving the evaluation data of the proposal activity transmitted from the user terminal 50. In step S17, the user evaluation reception unit 19 proceeds the process to step S21 and registers the proposal activity in the wish list when the evaluation level of the proposal activity by the user U recognized from the evaluation data is equal to or higher than a wish threshold value. In this case, the user U has selected the proposal activity as a candidate for the activity to be experienced.

On the other hand, when the evaluation level of the proposal activity is lower than the wish threshold value, the user evaluation reception unit 19 proceeds the process to step S19. In this case, the user U has not selected the proposal activity, and the proposal activity is not registered in the wish list.

5. Extraction Processing of Proposal Activity Based on Preference of User

Extraction processing of the proposal activity based on the preference of the user will be described with reference to flowcharts shown in FIGS. 10 and 11. Here, as shown in FIG. 12, a case will be described in which the proposal activity is extracted from four activities B1 to B4 in which prior probabilities and conditional probabilities are set for four users for which the suitability of the five types of preference categories A to E is set, as shown in FIG. 13. FIG. 12 shows that a preference category affixed with "Like" is set for each of the users.

In the following description, the user whose user ID is U03 in FIG. 12 is referred to as a first user, and users whose user IDs set with a preference category B are U01 and U04 are referred to as second users.

Figure 10:
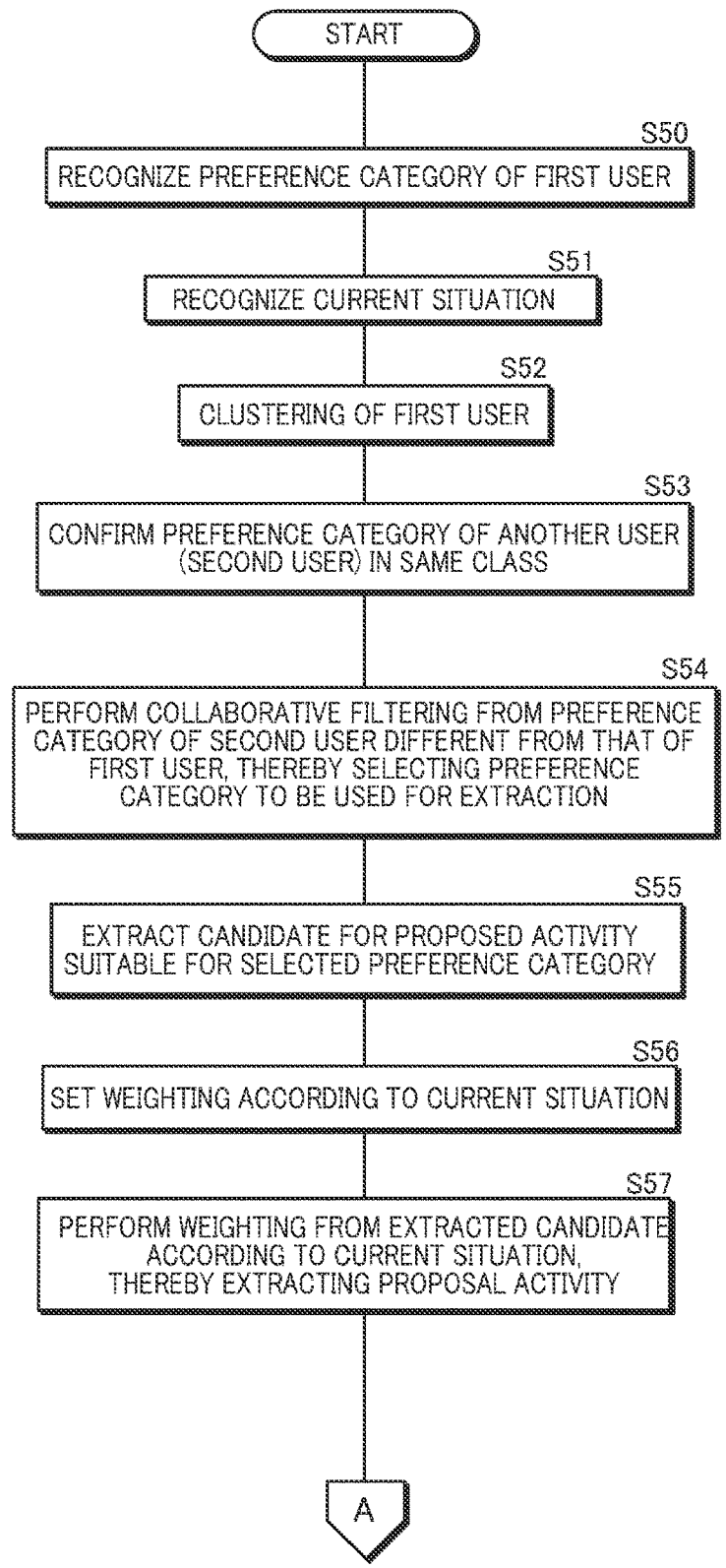
FIG. 10 is a first flowchart of the extraction processing of the proposal activity based on a preference.

In step S50 of FIG. 10, the user characteristic information acquisition unit 11 refers to the user DB 211, and recognizes a preference category A and a preference category C which are preference categories of the first user. Subsequently, in step S51, the current situation recognition unit 25 recognizes the user-specific situation and the general situation of the first user as the current situation, as described above. Subsequently, in step S52, the clustering unit 24 refers to the user DB 211, and makes the four users (including the first user) set with the preference category A as shown in FIG. 12 belong to the first class.

Subsequently, in step S53, the proposal activity information acquisition unit 17 recognizes the preference category of another user (second user) of the first class to which the first user belongs. In step S54, the proposal activity information acquisition unit 17 performs collaborative filtering from the preference category set for the second user, as shown in FIG. 12, and selects the preference category B, which is most favored by the second user, as a preference category to be used.

Subsequently, in step S55, by accessing the activity DB 201, the activity suitable for the preference category B is extracted as a candidate of the proposal activity for the first user. Here, as shown in C of FIG. 13, it is assumed that four activities B1 to B4 are extracted. Each of the prior probabilities of the activities B1 to B4 is set to 0.25.

Subsequently, in step S56, as shown in W of FIG. 13, the weighting setting unit 26 sets weighting for the activities B1 to B4 according to the difference of the weather (sunny, cloudy, rainy, etc.) that is the general situation recognized by the current situation recognition unit 25. Subsequently, in step S57, the proposal activity information acquisition unit 17 multiplies the prior probabilities of the activities B1 to B4 by the conditional probabilities according to the current weather to calculate reference values of the activities B1 to B4, extracts an activity having the maximum reference value as a proposal activity, and proceeds the process to step S58 in FIG. 11.

Figure 9:
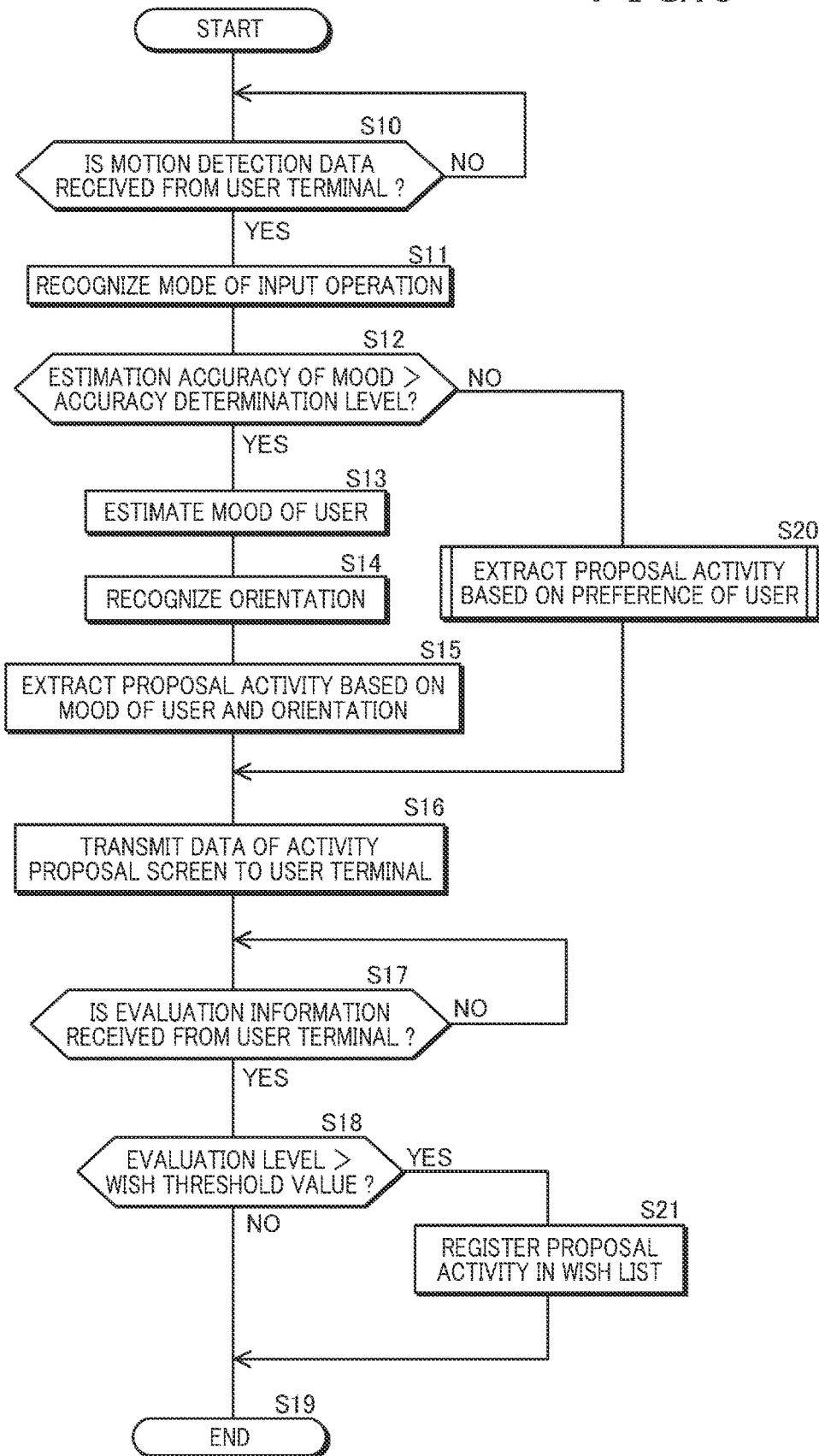
FIG. 9 is a flowchart of extraction processing of a proposal activity.
Figure 11:
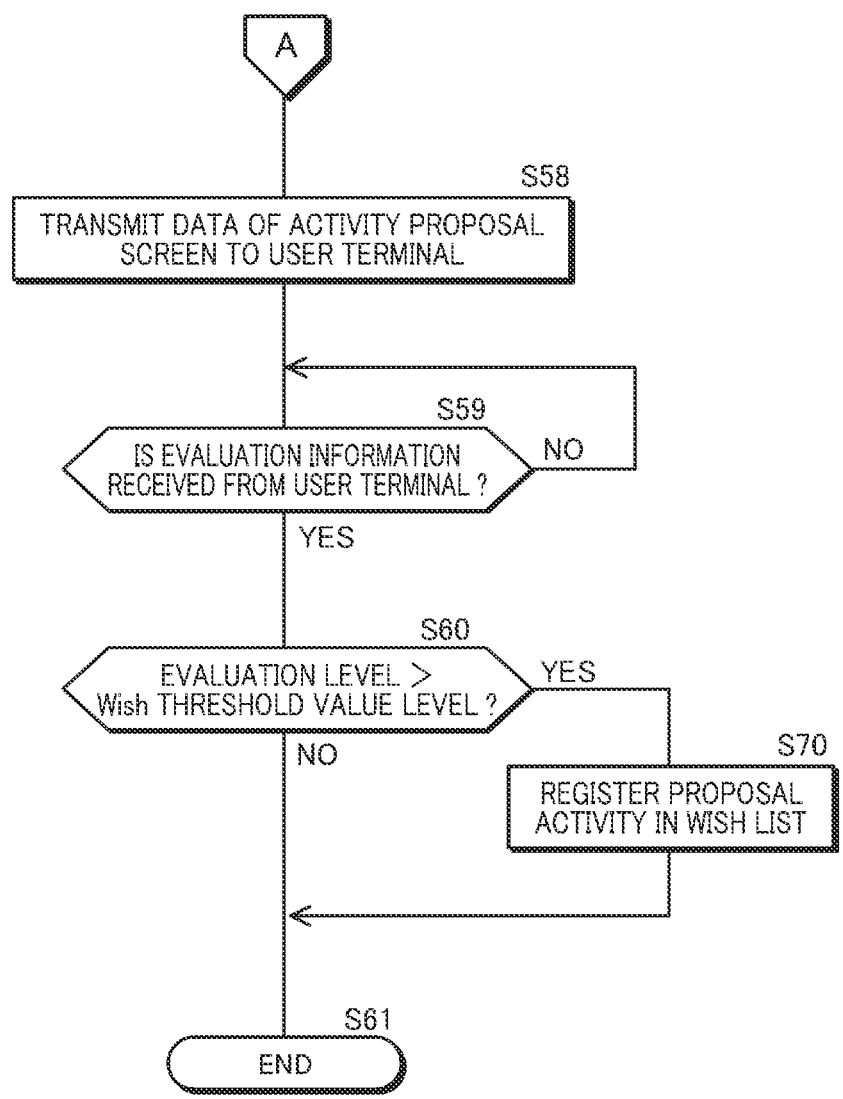
FIG. 11 is a second flowchart of the extraction processing of the proposal activity based on the preference.

Processes of steps S58 to S61 and step S70 in FIG. 11 are the same as the processes of steps S15 to S18 and step S21 in FIG. 9 described above, the activity proposal screen is displayed on the touch panel 51 of the user terminal 50, and the proposal activity is registered in the wish list of the user DB 211 according to the evaluation by the first user.

6. Other Embodiments

In the above-described embodiment, the user mood estimation unit 14 estimates the high degree of positiveness as the mood of the user, but may estimate the mood other than the positiveness. For example, the user's mood for movement may be estimated. In this case, the user mood estimation unit 14 estimates that the user wants to go far when the displacement of the user terminal 50 recognized by the input operation mode recognition unit 13 is large, and estimates that the user does not want to go far when the displacement of the user terminal 50 is small. Then, the proposal activity information acquisition unit 17 proposes the activity in an area where the distance from the current position of the user is long when estimating the mood that the user wants to go far, and proposes the activity in an area close to the current position of the user when estimating the mood that the user does not want to go far.

In the above-described embodiment, the input operation mode recognition unit 13 uses the displacement operation mode of the user terminal 50 detected by the motion sensor 52 or the operation mode of the touch panel 51 of the user terminal 50, as the input operation mode of the user, but may use only one of the operation modes.

In the above-described embodiment, as a mode of input operation to the input device by the user, the displacement mode of the user terminal 50 or the swipe operation of the user icon is recognized. However, as in the evaluation slider 140 in FIG. 4, a mode may be recognized as the input operation in which a plurality of sub-areas 141 to 145 having different colors or shades are displaced on the touch panel 51 and the user U touches any one of the sub-areas. In this case, the user mood estimation unit 14 estimates that the positiveness is high when the user U touches a bright color sub-area, and estimates that the positiveness is low when the user U touches a dark color sub-area.

In the above-described embodiment, the proposal activity information acquisition unit 17 extracts the proposal activity using the orientation in which the user terminal 50 is directed, but may extract the information activity without using the orientation information.

In the above-described embodiment, the recommendation system of the present disclosure is configured by the recommendation system 1 which is a computer system, but a part or all of the components of the recommendation system may be provided in the user terminal 50.

In the above-described embodiment, the weighting setting unit 26 performs the weighting on the candidate of the proposal activity according to the weather, as shown in FIG. 13. The weighting setting unit 26 may also appropriately perform the weighting on other current situations. For example, when it is assumed from the user's schedule that the time the user can spend on the activity is limited, the weighting of the candidate of the proposal activity may be set to be larger as the required time becomes shorter. In addition, the weighting may be set in a superimposed manner for a combination of the plurality of current situations (weather and distance).

In the above-described embodiment, the weighting setting unit 26 may evaluate the weighting setting based on the proposal activity extracted in steps S56 to S57 in FIG. 10, the current situation and the weighting used at the time of extraction, and the evaluation (selection situation) of the first user for the proposal activity, and may set, based on the evaluation result, the weighting in subsequent extraction of the first proposal activity by the proposal activity information acquisition unit 17.

FIG. 6 is a schematic view showing the functional configuration of the recommendation system 1 according to the main processing contents in order to facilitate the understanding of the present invention, and the configuration of the recommendation system 1 may be divided in another manner. Further, the processing of each of the components may be executed by one hardware unit, or may be executed by a plurality of hardware units. Further, the processing of each of the components shown in FIG. 7 and FIGS. 9 to 11 may be executed by one program, or may be executed by a plurality of programs.

The processing executed by the input operation mode recognition unit 13 corresponds to the input operation mode recognition step in a recommendation method of the present disclosure, and the processing executed by the proposal activity information acquisition unit 17 corresponds to a proposal activity information acquisition step in a recommendation method of the present disclosure. In addition, the processing executed by the output control unit 18 corresponds to an output control step in a recommendation method of the present disclosure.

7. Configuration Supported by Above-Described Embodiment

The above-described embodiment indicates specific examples of the following configurations.

(Configuration 1) A recommendation system including: an input operation mode recognition unit configured to recognize a mode of an input operation from a user to an input device; a user mood estimation unit configured to estimate a mood of the user, based on the mode of the input operation recognized by the input operation mode recognition unit; a proposal activity information acquisition unit configured to access an activity database in which activity information is stored, to extract a proposal activity suitable for the mood of the user estimated by the user mood estimation unit, and to acquire information on the proposal activity; and an output control unit configured to allow an output device to output the information on the proposal activity acquired by the proposal activity information acquisition unit, the output device being used by the user.

According to the recommendation system, the user can easily obtain information on the proposal activity that is expected to be suitable for a current mood by performing a simple action of changing the input operation mode according to his/her mood. Therefore, it can be expected that the recommendation system is actively utilized by users who examine the activity.

(Configuration 2) The recommendation system according to Configuration 1, wherein the input device is gripped and used by the user, and the input operation is a displacement operation of the input device by the user, and the input operation mode recognition unit recognizes, based on a detection signal of a motion sensor provided in the input device, at least one of a displacement amount, a displacement direction, a displacement speed, and a displacement acceleration of the input device due to the displacement operation, as the mode of the input operation.

According to the recommendation system of Configuration 2, the user can obtain information on the activity according to the mood rather than changing the method of displacing the gripped input device according to his/her mood.

(Configuration 3) The recommendation system according to Configuration 2, wherein the displacement operation is an operation in which the user swings a hand with which the input device is gripped.

According to the recommendation system of Configuration 3, the user can obtain information on the activity according to the mood by changing the method of swinging the hand with which the input device is gripped, according to his/her mood. Further, the magnitude of the user's operation is expected to reflect the mood of the user regardless of the presence or absence of the user's explicit consciousness.

(Configuration 4) The recommendation system according to any one of Configuration 1 to 3, wherein the input device includes a touch panel, and the input operation is an operation of the touch panel by the user, and the input operation mode recognition unit recognizes at least one of a duration time of a touch operation on the touch panel, a direction of a swipe operation, a speed of the swipe operation, and a path of the swipe operation, as the mode of the input operation.

According to the recommendation system of Configuration 4, the user can obtain information on the activity according to the mood by changing the operation method for the touch panel according to his/her mood.

(Configuration 5) The recommendation system according to any one of Configuration 1 to 4, wherein the input device includes a touch panel, and the input operation is an operation of the touch panel by the user, and the input operation mode recognition unit recognizes that the user touches any one of a plurality of selection areas having different shades or colors displayed on the touch panel, as the mode of the input operation.

According to the recommendation system of Configuration 5, the user can obtain information on the activity according to the mood by changing the selection area to be touched according to his/her mood.

(Configuration 6) The recommendation system according to any one of Configuration 1 to 5, further including: an orientation recognition unit configured to recognize an orientation in which the user or the input device is directed, wherein the proposal activity information acquisition unit extracts the proposal activity from activities that can be experienced in an area of the orientation in which the user or the input device is directed, which is recognized by the orientation recognition unit.

According to the recommendation system of Configuration 6, by performing the input operation on the input device such that the user is directed in the orientation in which the area of interest exists or the input device is directed in the orientation in which the area of interest exists, the user can obtain information on the activity that can be experienced in the area of interest or a path along the area of interest.

(Configuration 7) The recommendation system according to any one of Configuration 1 to 6, wherein the activity information stored in the activity database includes information on a preference suitable for an activity, the recommendation system includes a user preference information acquisition unit configured to access a user database in which preference information of the user is stored and to acquire the preference information of the user, the user mood estimation unit estimates, as the mood of the user, a high degree of positiveness of the user, and the proposal activity information acquisition unit extracts an activity in which suitability with a preference of the user recognized from the preference information of the user acquired by the user preference information acquisition unit is equal to or higher than a predetermined suitability determination level, as the proposal activity, and sets the suitability determination level to be low as the positiveness of the user estimated by the user mood estimation unit becomes higher.

According to the recommendation system of Configuration 7, when it is assumed that the user's positiveness is high, the information on the activity having low suitability with the user's preference is intentionally provided, and thus a challenge of an unexpected and fresh activity can be proposed to the user.

(Configuration 8) The recommendation system according to any one of Configuration 1 to 7, wherein the activity information stored in the activity database includes an assumption activity amount of an activity experiencer, the user mood estimation unit estimates a high degree of positiveness of the user as the mood of the user, and the proposal activity information acquisition unit extracts the proposal activity such that the assumption activity amount of the experiencer becomes larger as the positiveness of the user estimated by the user mood estimation unit becomes higher.

According to the recommendation system of Configuration 8, when it is assumed that the user's positiveness is high, a challenge to the activity having a lot of assumption activity and a high hurdle to experience can be proposed to the user.

(Configuration 9) The recommendation system according to any one of Configuration 1 to 8, wherein the activity information stored in the activity database includes information on a place where an activity can be experienced, the recommendation system includes a current position recognition unit configured to recognize a current position of the user or the input device, and the proposal activity information acquisition unit extracts the proposal activity such that a distance from the current position of the user or the input device recognized by the current position recognition unit to an experience place of the activity becomes longer as positiveness of the user estimated by the user mood estimation unit becomes higher.

According to the recommendation system of Configuration 9, when it is assumed that the user's positiveness is high, a challenge to the activity distant from the current position and having a high movement load to experience can be proposed to the user.

(Configuration 10) A recommendation method executed by a computer, including: an input operation mode recognition step of recognizing a mode of an input operation from a user to an input device; a user mood estimation step of estimating a mood of the user, based on the mode of the input operation recognized in the input operation mode recognition step; a proposal activity information acquisition step of accessing an activity database in which activity information is stored, extracting a proposal activity suitable for the mood of the user estimated in the user mood estimation step, and acquiring information on the proposal activity; and an output control step of allowing an output device to output the information on the proposal activity acquired in the proposal activity information acquisition step, the output device being used by the user.

When the recommendation method of Configuration 10 is executed by the computer, the same operational effect as the recommendation system of Configuration 1 can be obtained.

REFERENCE SIGNS LIST 1 recommendation system
10 CPU
11 user characteristic information acquisition unit
12 user characteristic recognition unit
13 input operation mode recognition unit
14 user mood estimation unit
15 estimation accuracy calculation unit
16 orientation recognition unit
17 proposal activity information acquisition unit
18 output control unit
19 user evaluation reception unit
20 rank assignment unit
21 evaluation element selection reception unit
22 acquisition time situation information storage unit
23 individual preference category setting unit
24 clustering unit
25 current situation recognition unit
26 weighting setting unit
27 activity planning unit
28 activity demand estimation unit
30 memory
50 user terminal
51 touch panel
52 motion sensor
53 orientation sensor
100 rank distance screen
110 user icon
130 activity proposal screen
150 activity list screen
200 activity information server
201 activity DB
210 user information server
211 user DB
U user

What is claimed is:

1. A recommendation system comprising:
a CPU that includes:
an input operation mode recognition unit configured to recognize a mode of an input operation from a user to an input device;
a user mood estimation unit configured to estimate a mood of the user, based on the mode of the input operation recognized by the input operation mode recognition unit;
a proposal activity information acquisition unit configured to access an activity database in which activity information is stored, to extract a proposal activity suitable for the mood of the user estimated by the user mood estimation unit, and to acquire information on the proposal activity; and
an output control unit configured to allow an output device to output the information on the proposal activity acquired by the proposal activity information acquisition unit, the output device being used by the user, wherein
the input device is gripped and used by the user, and the input operation is a displacement operation of the input device by the user, and the input operation mode recognition unit recognizes, based on a detection signal of a motion sensor provided in the input device, at least one of a displacement amount, a displacement direction, a displacement speed, and a displacement acceleration of the input device due to the displacement operation, as the mode of the input operation.

2. The recommendation system according to claim 1, wherein
the displacement operation is an operation in which the user swings a hand with which the input device is gripped.

3. The recommendation system according to claim 1, wherein
the input device includes a touch panel, and the input operation is an operation of the touch panel by the user, and
the input operation mode recognition unit recognizes at least one of a duration time of a touch operation on the touch panel, a direction of a swipe operation, a speed of the swipe operation, and a path of the swipe operation, as the mode of the input operation.

4. The recommendation system according to claim 1, wherein
the input device includes a touch panel, and the input operation is an operation of the touch panel by the user, and
the input operation mode recognition unit recognizes that the user touches any one of a plurality of selection areas having different shades or colors displayed on the touch panel, as the mode of the input operation.

5. The recommendation system according to claim 1, wherein the CPU further comprises:
an orientation recognition unit configured to recognize an orientation in which the user or the input device is directed, wherein
the proposal activity information acquisition unit extracts the proposal activity from activities that can be experienced in an area of the orientation in which the user or the input device is directed, which is recognized by the orientation recognition unit.

6. The recommendation system according to claim 1, wherein
the activity information stored in the activity database includes information on a preference suitable for an activity,
the CPU includes a user preference information acquisition unit configured to access a user database in which preference information of the user is stored and to acquire the preference information of the user,
the user mood estimation unit estimates, as the mood of the user, a high degree of positiveness of the user, and
the proposal activity information acquisition unit extracts an activity in which suitability with a preference of the user recognized from the preference information of the user acquired by the user preference information acquisition unit is equal to or higher than a predetermined suitability determination level, as the proposal activity, and sets the suitability determination level to be low as the positiveness of the user estimated by the user mood estimation unit becomes higher.

7. The recommendation system according to claim 1, wherein
the activity information stored in the activity database includes an assumption activity amount of an activity experiencer, the user mood estimation unit estimates a high degree of positiveness of the user as the mood of the user, and the proposal activity information acquisition unit extracts the proposal activity such that the assumption activity amount of the experiencer becomes larger as the positiveness of the user estimated by the user mood estimation unit becomes higher.

8. The recommendation system according to claim 1, wherein the activity information stored in the activity database includes information on a place where an activity can be experienced, the CPU includes a current position recognition unit configured to recognize a current position of the user or the input device, and the proposal activity information acquisition unit extracts the proposal activity such that a distance from the current position of the user or the input device recognized by the current position recognition unit to an experience place of the activity becomes longer as positiveness of the user estimated by the user mood estimation unit becomes higher.

9. A recommendation method executed by a computer, comprising:

an input operation mode recognition step of recognizing a mode of an input operation from a user to an input device;

a user mood estimation step of estimating a mood of the user, based on the mode of the input operation recognized in the input operation mode recognition step;

a proposal activity information acquisition step of accessing an activity database in which activity information is stored, extracting a proposal activity suitable for the mood of the user estimated in the user mood estimation step, and acquiring information on the proposal activity; and an output control step of allowing an output device to output the information on the proposal activity acquired in the proposal activity information acquisition step, the output device being used by the user, wherein the input device is gripped and used by the user, and the input operation is a displacement operation of the input device by the user, and the input operation mode recognition step recognizes, based on a detection signal of a motion sensor provided in the input device, at least one of a displacement amount, a displacement direction, a displacement speed, and a displacement acceleration of the input device due to the displacement operation, as the mode of the input operation.

10. A recommendation system comprising:

a CPU that includes:

an input operation mode recognition unit configured to recognize a mode of an input operation from a user to an input device;

a user mood estimation unit configured to estimate a mood of the user, based on the mode of the input operation recognized by the input operation mode recognition unit;

a proposal activity information acquisition unit configured to access an activity database in which activity information is stored, to extract a proposal activity suitable for the mood of the user estimated by the user mood estimation unit, and to acquire information on the proposal activity; and an output control unit configured to allow an output device to output the information on the proposal activity acquired by the proposal activity information acquisition unit, the output device being used by the user, wherein the input device includes a touch panel, and the input operation is an operation of the touch panel by the user, and the input operation mode recognition unit recognizes at least one of a duration time of a touch operation on the touch panel, a direction of a swipe operation, a speed of the swipe operation, and a path of the swipe operation, as the mode of the input operation.

11. A recommendation system comprising:

a CPU that includes:

an input operation mode recognition unit configured to recognize a mode of an input operation from a user to an input device;

a user mood estimation unit configured to estimate a mood of the user, based on the mode of the input operation recognized by the input operation mode recognition unit;

a proposal activity information acquisition unit configured to access an activity database in which activity information is stored, to extract a proposal activity suitable for the mood of the user estimated by the user mood estimation unit, and to acquire information on the proposal activity; and an output control unit configured to allow an output device to output the information on the proposal activity acquired by the proposal activity information acquisition unit, the output device being used by the user, wherein the input device includes a touch panel, and the input operation is an operation of the touch panel by the user, and the input operation mode recognition unit recognizes that the user touches any one of a plurality of selection areas having different shades or colors displayed on the touch panel, as the mode of the input operation.

12. A recommendation system comprising:

a CPU that includes:

an input operation mode recognition unit configured to recognize a mode of an input operation from a user to an input device;

a user mood estimation unit configured to estimate a mood of the user, based on the mode of the input operation recognized by the input operation mode recognition unit;

a proposal activity information acquisition unit configured to access an activity database in which activity information is stored, to extract a proposal activity suitable for the mood of the user estimated by the user mood estimation unit, and to acquire information on the proposal activity;

an output control unit configured to allow an output device to output the information on the proposal activity acquired by the proposal activity information acquisition unit, the output device being used by the user; and an orientation recognition unit configured to recognize an orientation in which the user or the input device is directed, wherein the proposal activity information acquisition unit extracts the proposal activity from activities that can be experienced in an area of the orientation in which the user or the input device is directed, which is recognized by the orientation recognition unit.

\* \* \* \* \*